United States Patent [19]
Barthel et al.

[11] Patent Number: 6,071,143
[45] Date of Patent: Jun. 6, 2000

[54] CABINET FOR INSERTION OF CIRCUIT BOARDS IN TIGHT SPACES

[75] Inventors: Steven George Barthel, Kingston; Edward Francis Furey, Stone Ridge; Jody Allen Hickey; Wade Harold White, both of Hyde Park, all of N.Y.

[73] Assignee: International Business Machines Corporation, Armonk, N.Y.

[21] Appl. No.: 08/766,566

[22] Filed: Dec. 13, 1996

[51] Int. Cl.⁷ .................................................. H01R 13/64
[52] U.S. Cl. ............................................................ 439/377
[58] Field of Search ............................. 439/377, 64, 259, 439/342, 260, 928.1; 361/737, 741, 756, 801, 802, 752

[56] References Cited

U.S. PATENT DOCUMENTS

| | | | |
|---|---|---|---|
| 4,797,786 | 1/1989 | Belanger, Jr. ........................ | 361/802 X |
| 5,317,481 | 5/1994 | Hillis et al. .......................... | 361/752 X |
| 5,644,470 | 7/1997 | Benedict et al. . | |
| 5,657,204 | 8/1997 | Hunt ...................................... | 439/64 X |

*Primary Examiner*—Paula Bradley
*Assistant Examiner*—Daniel Wittels
*Attorney, Agent, or Firm*—Floyd A. Gonzalez; Lawrence D. Cutter; Cantor Colburn

[57] ABSTRACT

A retainer frame for holding a standard printed circuit board or other electronic card is sized and adapted for insertion and removal in tight places. In particular, the retainer frame, together with an actuator bar, is employed in conjunction with a cabinet with guides and a stop mechanism to produce an initially horizontal insertion motion followed immediately by a vertical motion during which electrical connection is made between the card and a corresponding connector in the cabinet.

7 Claims, 5 Drawing Sheets

CABINET FOR INSERTION OF CIRCUIT BOARDS IN TIGHT SPACES

BACKGROUND OF THE INVENTION

The present invention is generally directed to a frame and cabinet arrangement which permits electronic circuit boards to be inserted without the need to open a cabinet to do so. More particularly, the present invention includes a frame for holding a printed circuit board so that it may be inserted into a slot in a first, horizontal direction and, upon hitting a stop mechanism, it is then made to move at right angles to the first direction so as to directly insert an edge connector or similar connector into an appropriately corresponding mating connector. Even more particularly, the present invention provides a system, cabinet and method for inserting electronic circuit boards associated with personal computers or other electronic equipment into appropriately designed and mating cabinetry without having to take any of the covers off. The present invention particularly includes a case or cabinet which is suitable for use with the frame and circuit board assemblies also described herein.

The insertion and removal of electronic circuit boards in personal computers and/or other electronic equipment has, over the years, been associated with the necessity to remove the surrounding cabinetry or covers so that the board may be plugged directly into a mating socket on a mother board. This insertion and removal process, although necessary, is time consuming and unnecessary.

Other individuals have tried but failed to provide a mechanism which produces the most desirable relative motion between the cabinet and the circuit board which is to be placed in or removed from operation. In particular, it should be appreciated that the ideal motion of the circuit board with respect to the connector is one in which the board moves perpendicular relative to the plane with a connector so that, for example, card edge connectors are inserted directly without horizontal movement accompanying the contact. For example, in U.S. Pat. No. 3,869,185 issued to Teagno, an insertion mechanism is provided based upon cam action. However, it is noted that this arrangement results in the contacts and the connector moving in a non-perpendicular fashion with respect to one another at the point of contact. This is undesirable in that it produces unnecessary friction and limits the nature of the connectors which may be employed. In particular, pin connections are unsuitable in this arrangement. Similarly, the design shown in U.S. Pat. No. 5,366,385 issued to Treleaven is also undesirable in that the ultimate connection between contacts on a board and a connector is made via a rotational movement rather than via direct insertion of the (male or female) connector into its (respectively corresponding female or male) mating counterpart.

One of the major problems associated with electronic equipment which employs pluggable circuit cards is that there is an implicit requirement that there be room for insertion of these cards. In particular, the assumption is that the card must be inserted perpendicularly to its mating connector. It is also typically assumed that the distance that the card must be moved in the perpendicular direction is at least equal to the height of the card to be inserted. However, this assumption is overcome in the present invention which only requires a connector's the height (shortest printed circuit board direction) for interconnection. This is particularly true for circuit boards conforming to PCI, AIB, ISA, EISA or MCA Standards. While the present invention is particularly directed to electronic circuit cards conforming to one or more of these Standards, it is not limited hereto and is applicable to any electronic circuit board with a connector along the edge which is to be inserted directly into a mating connector especially when in tight spaces.

SUMMARY OF THE INVENTION

In accordance with an invention which is related to the cabinet herein, a frame, for holding a printed circuit board having at least one connector along its edge, includes a side portion which has an outside edge and an inside edge. The side portion has at least one slot therein which is oriented so as to slope away, for at least some distance, from the inside edge of the side portion towards the outside edge of the side portion. The slot is open at least at one end thereof. The frame also includes at least two arms extending from the inside edge of the side portion and terminating in arm end portions having at least one slot therein which is open in a direction facing inwardly. The arm end portions in particular provide a mechanism in which a printed circuit board is held in the frame between the outside edge portion and slots in the arm ends. The frame holder is particularly suited for holding a plurality of different printed circuit boards and is particularly useful in those situations in which they possess standard dimensions.

In preferred embodiments, the combination of the circuit board in the above-described frame are used in conjunction with an actuator bar which possesses a substantially U-shaped channel into which the outer edge of the side portion is inserted. The channel of the actuator bar also possesses at least one pin or other protrusion which extends interiorly from the side wall of the channel and is positioned for slidable insertion into an angled slot in the frame. The actuator bar also preferably includes exteriorly disposed, elongated support tabs for insertion into a corresponding cabinet guide.

In operation, the printed circuit board, the frame and the actuator bar assembly are inserted into a slot in the cabinet or case of the present invention so that the support tabs enter corresponding guide rail slots from which the assembly is essentially suspended. The frame arm end portions also preferably assist the guidance of the assembly into a slot and further act to prevent cantilevering or other jamming motions of the assembly. The frame and circuit board are then inserted further into the cabinet slot until a stop mechanism precludes further horizontal motion. At this point, inward pressure on the actuator bar urges the connector on the frame and printed circuit board assembly in a direction perpendicular to the horizontal directly into a mating electrical connector so that electrical connections are made between the circuit board and an underlying mother board or other similar device.

In preferred embodiments of the present invention, a cabinet which is specifically usable for use with the retaining frame is described. This cabinet includes floor and a ceiling which is (in general) substantially parallel to the floor. The cabinet also includes walls (or other means as needed) which are affixed to the floor and to the ceiling for holding the floor and the ceiling in fixed relative position to one another. The cabinet also includes at least one (typically elongate) connector disposed either directly or indirectly on the floor of the cabinet. In particular, the floor of the cabinet may also include a mother board or other similar device for circuit interconnection. Additionally, at least one guide is disposed on the ceiling portion of the cabinet so that the above-mentioned support tabs on the actuator bar can engage corresponding slots in the guide so as to provide suspension and guidance for the assembly as it is inserted into a cabinet slot.

Accordingly, it is an object of the present invention to provide a cabinet which is particularly usable in conjunction with the retaining frame and circuit board assembly aspects of the present invention.

It is still another object of the present invention to provide a retaining frame for holding a printed circuit board during insertion operations.

It is another object of the present invention to provide a system for inserting a circuit board into a tightly spaced volume with access only being provided from one side.

It is a still further object of the present invention to provide a system and method for tightly packaging and arranging arrays of electronic circuit boards.

It is also an object of the present invention to provide a system for circuit board insertion in which insertion is accomplished by means of a final motion which is perpendicular to the direction of circuit board insertion.

It is also an object of the present invention to provide a method and arrangement for both the insertion and removal of printed circuit boards in tight spaces.

It is a still further object of the present invention to provide a method for inserting printed circuit boards without the concomitant problems associated with insertion cantilevering and jamming.

It is yet another object of the present invention to provide an array of printed circuit boards which may be spaced relatively close to one another, especially in a direction which implies stacking of circuit boards.

It is a still further object of the present invention to provide a retaining frame for a variety of printed circuit boards having a standard dimensions and connections.

It is yet another object of the present invention to provide a printed circuit board which may be easily inserted and removed from a piece of electronic equipment, such as a personal computer, in conjunction with so-called hot-pluggable technologies.

It is a still further object of the present invention to provide a retaining frame (and/or actuator bar combination) which easily accommodates transport and insertion of printed circuit boards.

It is a still further object of the present invention to provide a mechanism for simultaneously holding and retaining mother and daughter printed circuit boards and/or circuit boards having non-standard dimensions.

Lastly, but not limited hereto, it is an object of the present invention to provide a method and system for electronic circuit board insertion in which, at a point of the insertion, the horizontal direction of travel changes, at which time, further movement is in a direction perpendicular to the initial horizontal movement, together with associated reversal of this sequence upon printed circuit board removal.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

DETAILED DESCRIPTION OF THE INVENTION

Figure 1:
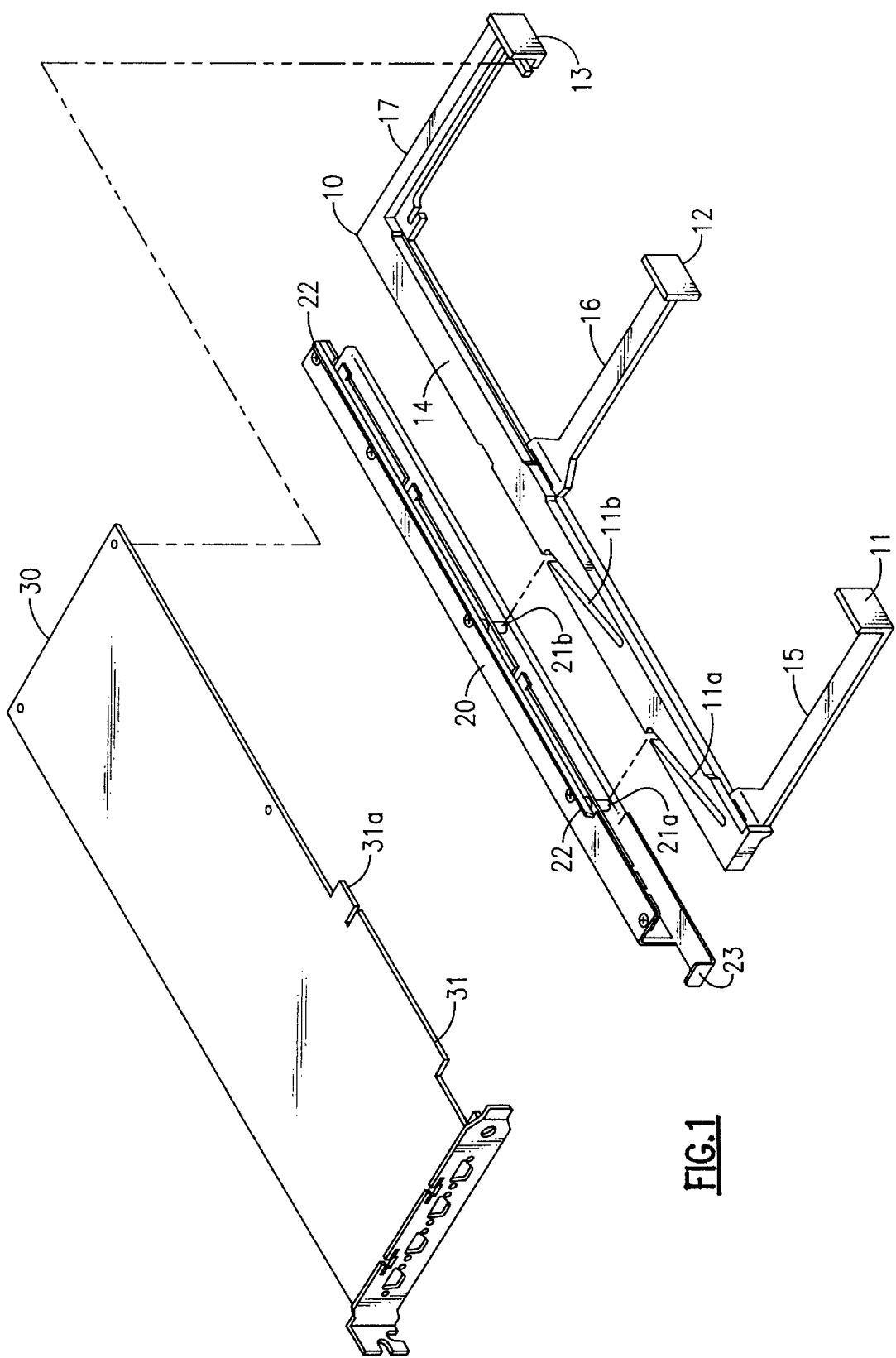
FIG. 1 is an isometric exploded view illustrating a frame actuator bar and printed circuit board assembly usable with the present invention.

In accordance with an invention related to the cabinet system herein, frame 10, for holding printed circuit board 30, includes side portion 14 which has an outside edge and an inside edge. Side portion 14 includes two slots, 11a and 11b, for receipt of pins, 21a and 21b, which extend across a channel in actuator bar 20. Slots 11a and 11b are sloped and are open on the outer edge of side portion 14. Frame 10 also includes at least two arms extending from the inside edge of side portion 14. These arms, 15, 16 and 17, are dimensioned in accordance with the width 30 of printed circuit board 30 which is meant to be held by frame 10. Arm extensions 15, 16 and 17 also preferably include arm end portions 11, 12 and 13, respectively, which include slots (not visible in FIG. 1) for receipt of an edge of circuit board 30. Frame 10 is also sized in accordance with the length of circuit board 30 which is easily snapped into place in frame 10 which acts as a carrier for the circuit board. It should also be noted that arm end portions 11, 12 and 13 can also function as partial guide members when the assembly of the present invention is inserted into a corresponding slot in a case, cabinet, panel or other electrical equipment rack.

Figure 3:
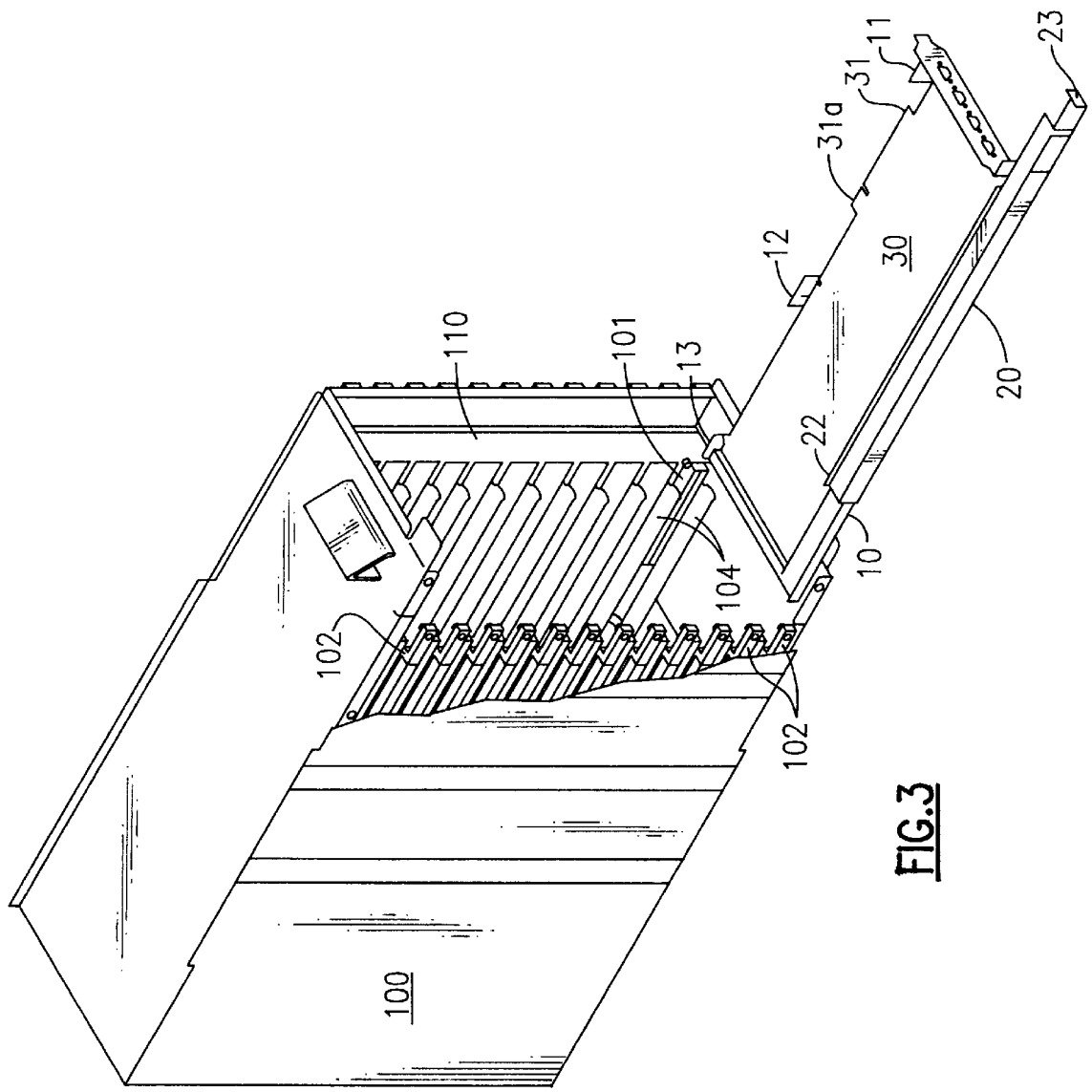
FIG. 3 is an isometric view illustrating the initial insertion of a printed circuit board assembly into a cabinet in accordance with the present invention which is particularly suitable for receipt of this assembly.
Figure 4:
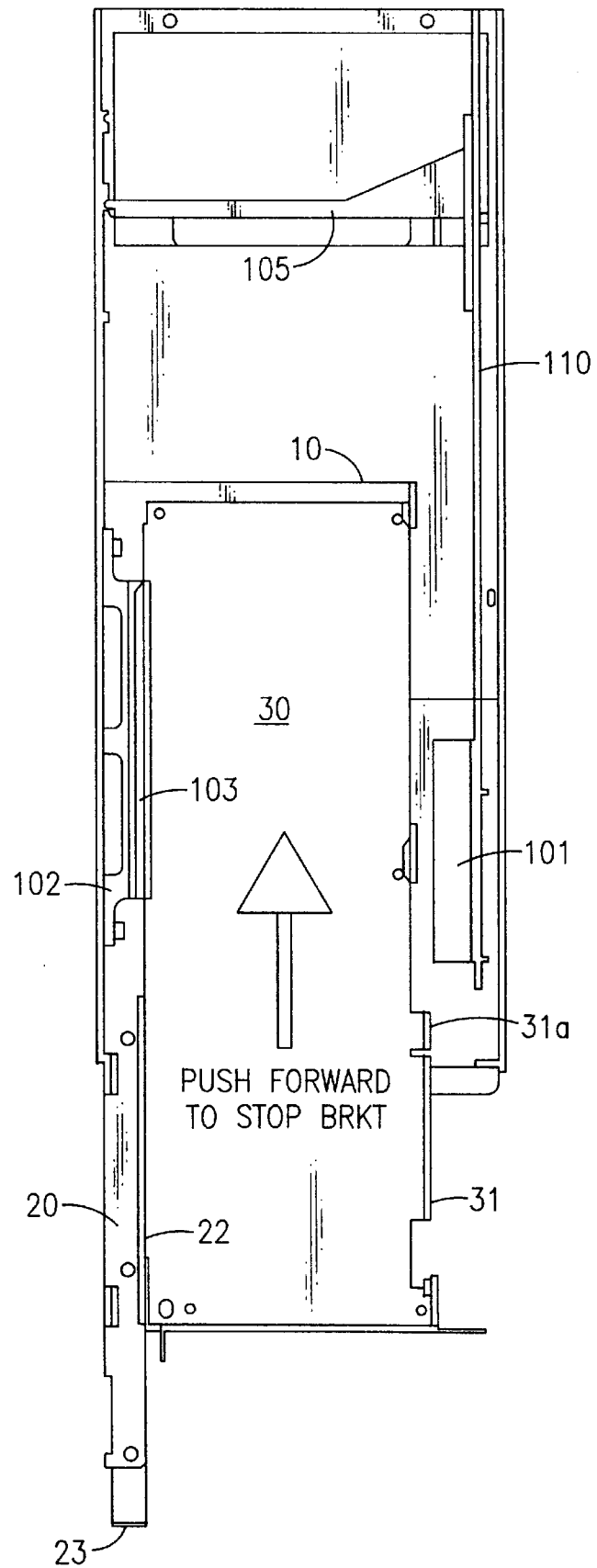
FIG. 4 is a side elevation view showing a printed circuit board assembly in a partially inserted stage during which the insertion motion is essentially horizontal.
Figure 5:
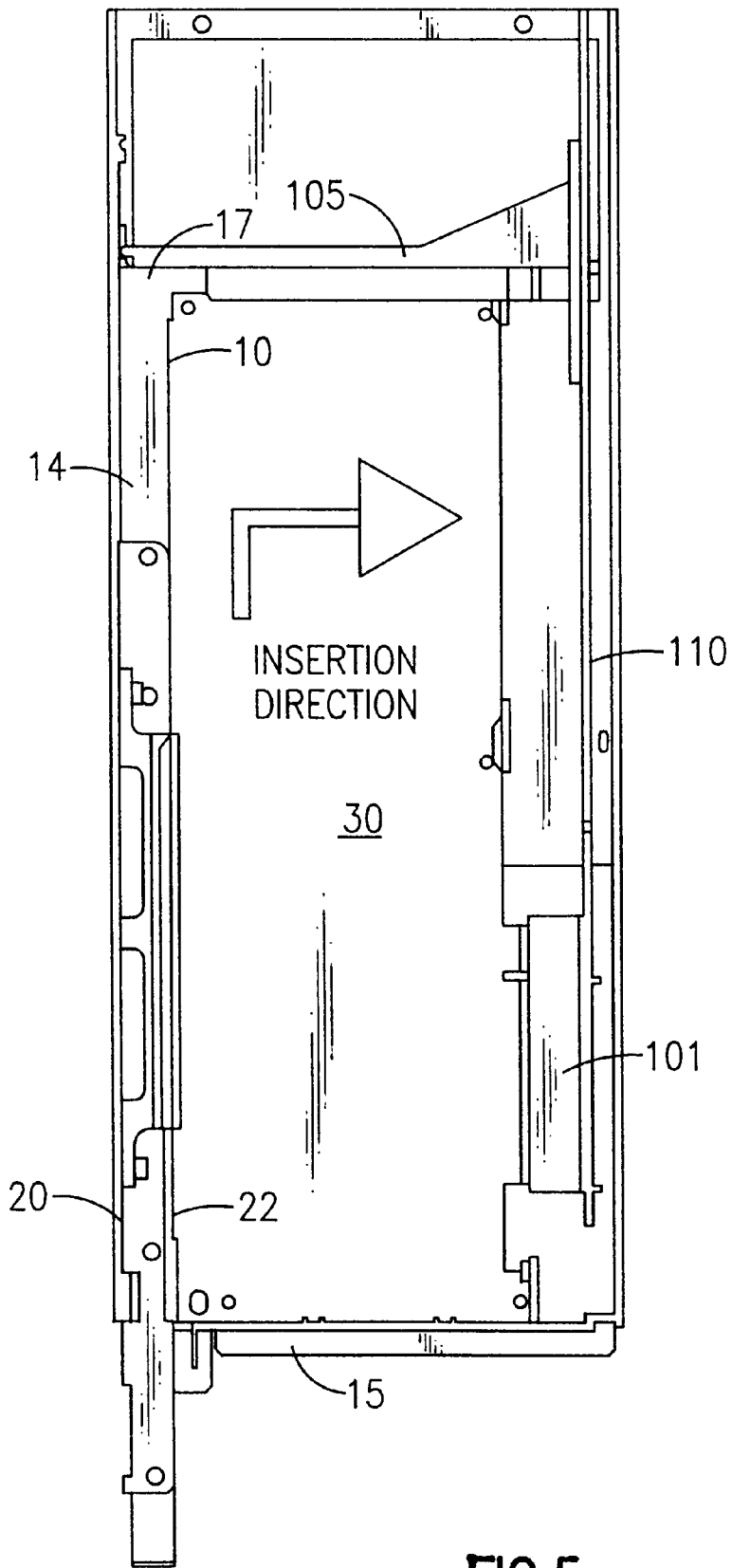
FIG. 5 is a view similar to FIG. 4 illustrating a stage of insertion immediately prior to transition to a downward motion which effects an electrical connection between the circuit board and a connector in the cabinet.

The assembly also preferably employs actuator bar 20 which preferably exists in the form of a generally U-shaped channel as shown. It is into this channel that side portion 14 of frame 10 is inserted prior to insertion of the resulting assembly of the present invention into a corresponding equipment slot. Actuator bar 20 includes pin members 21a and 21b which extend across the channel and which are positioned so as to be simultaneously insertable into slots 11a and 11b in side portion 14 of frame 10. Actuator bar 20 also includes elongated side support tabs 22 on the exterior thereof. Support tabs 22 provide a suspension function associated with corresponding guide slots in an appropriately configured cabinet which is more particularly described below and which is shown in FIGS. 3, 4 and 5.

During use of the present invention, circuit board 30 is first typically snapped into place in frame 10. At this point (or before if convenient), actuator bar 20 is mated with side portion 14 of frame 10. In this operation, pins 21a and 21b are inserted into slots 11a and 11b, respectively, and actuator bar 20 is positioned so that these pins are at the bottom of their respective slots. It is in this configuration that the assembly is now ready for insertion into an electrical system. This insertion and a corresponding removal operation are described more particularly below.

Actuator bar 20 preferably comprises a plated metal channel member with metal pins 21a and 21b. While preferred aspects of the present system include pins 21a and 21b which extend entirely across the channel in actuator bar 20, it should be noted that any appropriately sturdy protrusion extending from the side walls of the channel could be used for insertion into slots 11a and 11b, the primary requirement being that these protrusions be slidable in their respective slots. While actuator bar 20 preferably comprises a metallic material, it is also noted that actuator bar 20 may comprise material which is plastic, polymeric or an appropriately sturdy composite material. Actuator bar 20 also preferably includes push arm 23 for facilitating assembly insertion. Along these same lines, it is also noted that frame 10 also preferably comprises a rigid, sturdy polymeric material.

It is also noted that printed circuit board 30, which is not limited in any way to any particular printed circuit board architecture or design, typically includes edge connectors such as 31 and 31a as shown. In the particular embodiment shown in FIG. 1, circuit board 30 includes standard connectors which are shown as metallic LAN portions present as conductive strips lying in a row along edge connectors 31 and 31a. In point of fact, the edge connectors may be divided in any convenient manner to achieve, for example, architectural compatibilities with earlier architectural designs.

Figure 2:
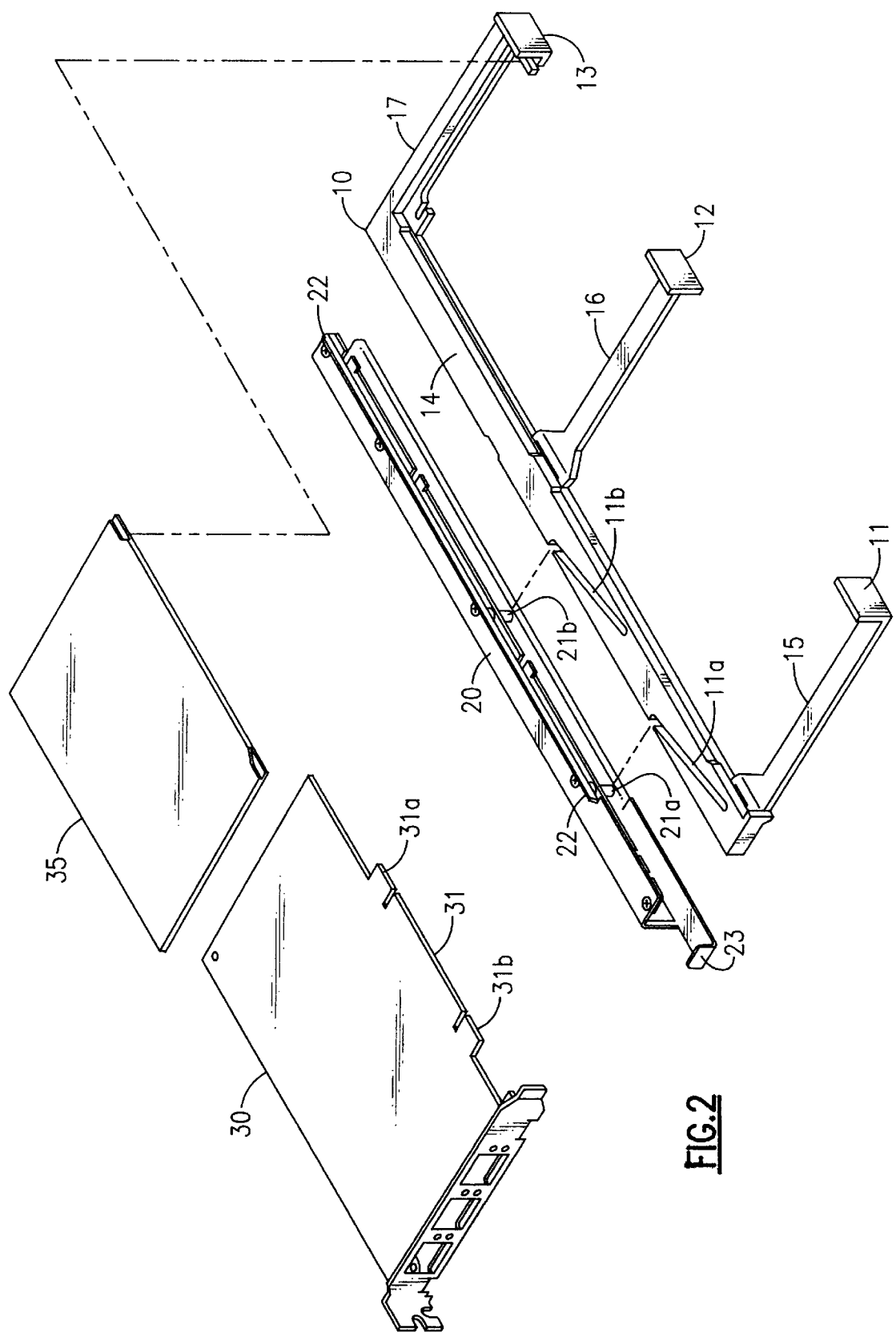
FIG. 2 is a view similar to FIG. 1 more particularly illustrating the incorporation of a filler card.

FIG. 2 illustrates an alternate embodiment of an assembly in accordance with the present invention in which, in addition to main printed circuit board 30, there is also present filler card 35. Both of these cards are easily snapped into place into frame 10. It is noted that card 35 acts as a space filler in those circumstances where short printed circuit cards 30 are employed. Short printed circuit cards 30 may also include edge connector portions 31, 31a and 31b as shown in conformance with various bus architectures.

FIG. 3 illustrates the frame/actuator bar/printed board assembly being inserted into cabinet 100 of the present invention. Cabinet 100 preferably includes a plurality of slots for receipt of such cards. Single-slot cabinets are not, however, precluded. In particular, each slot includes connector 101 which is typically attached to a mother board (see reference numeral 110 in FIG. 5). Cabinet 100 includes a floor and a ceiling, and side walls for supporting the floor and ceiling and for maintaining the floor and ceiling in a substantially parallel, spaced-apart relationship. In fact, the essence of the cabinet is its floor and ceiling together with any mechanism which serves to hold the floor and ceiling at a fixed distance apart. Cabinet 100 also includes guides 102 disposed along the ceiling of the cabinet or case. Guides 102 (mounted typically in pairs) include guide slots 103 therein for receipt of actuator bar support tab 22. These tabs 22 on actuator bar 20 slide into guide slots 103 on adjoining guides 102 and act to essentially suspend the assembly and to guide it during its horizontal insertion. Additionally, it is noted that arm end portions 11, 12 and 13 are also preferably sized and positioned so as to guide the assembly at its lower edge. In particular, arm end portions 11, 12 and 13 slide between lower guides 104 which are positioned on a mother board or on the floor of cabinet 100.

FIG. 4 is a side elevation view similar to FIG. 3 except that it illustrates a stage of insertion of the assembly into the cabinet which is more advanced. In particular, however, FIG. 4 also illustrates stop or detent mechanism 105. Upon insertion of the assembly into the cabinet, actuator bar tabs 22 initially engage guide slots 103 in upper guides 102. Subsequent to this, the assembly is essentially suspended and further insertion occurs in a horizontal direction until frame 10 encounters stop 105. At this point, pressure is applied inwardly on push arm 23 of actuator bar 20. The presence of pins 21a and 21b in slots 11a and 11b thereby cause, upon urging via push arm 23, the direction of motion of the assembly to change from the horizontal to the vertical as illustrated in FIG. 5. This vertical motion causes insertion of edge connectors 31 and 31a into corresponding connector 101 on mother board 110.

In the reverse direction, when arm 23 of actuator bar 20 is pulled outwardly, movement of pins 21a and 21b in slots 11a and 11b operates to move the assembly in a vertical direction and to thus remove the edge connector from its corresponding (mother board) connector. Further urging outward of actuator bar 20 causes a sliding motion of support tabs 22 in guide slots 103 of guides 102. In this way, the assembly which includes the printed circuit board is withdrawn from the cabinet.

While the figures herein illustrate a preferred embodiment of the present invention, it is noted that other variations may be employed without departing from the scope of the invention. In particular, it is noted that, while the figures herein indicate the presence of two slots in side portion 14, it is possible to use only a single slot and/or more than two slots. It is also noted that the essence of the vertical motion is imparted by means of an inclined plane. In this regard, it is possible to employ opposed inclined planes to affect the same motion. In such an arrangement, one inclined plane is present on frame side portion 14 and the other mirror image inclined plane is incorporated into actuator bar 20. It is further noted that, while the description herein has referred to horizontal and vertical directions, these have been indicated herein primarily for convenience only. It should be understood that the present invention is operable in all orientations. It is further noted that slots 11a and 11b in frame member 10 are shown as extending entirely through side portion 14. It is not necessary for this to be the case, although, it is the preferred embodiment. Furthermore, in preferred embodiments, frame member 10 comprises a single piece of molded plastic. It is also noted that the mating connectors, as shown in the drawings herein, represent the standard PC-type of edge connector. However, it is noted that any appropriate connector pair configuration may be employed. It is, furthermore, not necessary that card 30 solely contains male connector parts. Any matching set of male and female connector pairs may be employed.

From the above, it should be appreciated that all of the above-mentioned objects of the present invention have been met by the frame assembly actuator bar and cabinet mechanisms described and illustrated in FIGS. 1–5. In particular, there is provided a mechanism which makes it extremely easy to insert and remove printed circuit boards and/or other circuit cards from a personal computer and/or any other piece of electronic equipment and especially from rack-mounted equipment. The insertion and withdrawal is smooth and effective and can be accomplished in very tight spaces with absolutely no modifications made to the printed circuit boards themselves. It is, however, noted that it is possible to eliminate the frame by providing sloped slots directly in the printed circuit board itself.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

The invention claimed is:

1. A cabinet for inserting therein at least one printed circuit board coupled to an actuator bar having support tabs extending therefrom, said cabinet comprising:

a floor;

a ceiling substantially parallel to said floor;

walls affixed to said floor and said ceiling for holding said floor and said ceiling in a fixed relative position;

at least one elongate connector disposed on said floor;

a pair of spaced apart guides disposed on said ceiling so that each of said guides is parallel to said elongate connector, said guides being positioned on opposite sides of said elongate connector, each of said guides including a guide slot formed therein, said guide slot being substantially parallel to said ceiling and said floor and positioned for receiving the support tabs on the actuator bar.

2. The cabinet of claim 1 in which there are a plurality of connectors and guides with guide slots arranged opposite to other ones of said elongate electrical connectors.

3. The cabinet of claim 1 in which said floor comprises a mother board.

4. The cabinet of claim 1 in which a mother board is disposed above said floor and which contains said at least one elongate electrical connector.

5. The cabinet of claim 1 further including a stop mechanism.

6. The cabinet of claim 1 further comprising a lower guide positioned adjacent to said at least one elongate connector.

7. The cabinet of claim 1 wherein said pair of guides straddles said elongate connector.

* * * * *

UNITED STATES PATENT AND TRADEMARK OFFICE
CERTIFICATE OF CORRECTION

PATENT NO. : 6,071,143
DATED : June 6, 2000
INVENTOR(S) : Steven G. Barthel et al.

It is certified that error appears in the above-identified patent and that said Letters Patent is hereby corrected as shown below:

<u>Title page,</u>
Item [56], References Cited, U.S. PATENT DOCUMENTS, insert:
-- 3,869,185    3/1975   Teagno
5,366,385     11/1994 Treleaven
5,492,481     2/1996   Lewis --

Signed and Sealed this

Seventeenth Day of February, 2004

JON W. DUDAS
*Acting Director of the United States Patent and Trademark Office*